(12) United States Patent
Sato et al.

(10) Patent No.: US 8,501,141 B2
(45) Date of Patent: Aug. 6, 2013

(54) METHOD FOR PRODUCING GROUP III NITRIDE SEMICONDUCTOR

(75) Inventors: Takayuki Sato, Aichi-ken (JP); Seiji Nagai, Aichi-ken (JP); Makoto Iwai, Kasugai (JP); Shuhei Higashihara, Nagoya (JP); Yusuke Mori, Suita (JP); Yasuo Kitaoka, Suita (JP)

(73) Assignees: Toyoda Gosei Co., Ltd., Kiyosu-Shi, Aichi-Ken (JP); NGK Insulators, Ltd., Nagoya, Aichi-Pref. (JP); Osaka University, Suita-Shi, Osaka (JP)

( * ) Notice: Subject to any disclaimer, the term of this patent is extended or adjusted under 35 U.S.C. 154(b) by 0 days.

(21) Appl. No.: 12/662,006

(22) Filed: Mar. 26, 2010

(65) Prior Publication Data

US 2010/0247418 A1    Sep. 30, 2010

(30) Foreign Application Priority Data

Mar. 30, 2009   (JP) ................ 2009-082280

(51) Int. Cl.
| | |
|---|---|
| *C01B 21/06* | (2006.01) |
| *C30B 15/00* | (2006.01) |
| *C30B 9/00* | (2006.01) |
| *C30B 19/00* | (2006.01) |
| *C30B 11/00* | (2006.01) |
| *C30B 25/00* | (2006.01) |
| *C30B 28/14* | (2006.01) |
| *H01L 21/00* | (2006.01) |
| *H01L 33/00* | (2010.01) |
| *H01L 21/02* | (2006.01) |
| *H01B 1/02* | (2006.01) |
| *H01B 1/04* | (2006.01) |

(52) U.S. Cl.
USPC ............ 423/409; 117/13; 117/73; 117/64; 117/78; 117/89; 438/495; 438/499; 438/501; 257/106; 257/616; 252/521.5; 252/502; 252/503

(58) Field of Classification Search
None
See application file for complete search history.

(56) References Cited

U.S. PATENT DOCUMENTS 7,883,645 B2 * 2/2011 Friedrich et al. .......... 252/521.5
2006/0051942 A1   3/2006 Sasaki et al.
(Continued)

FOREIGN PATENT DOCUMENTS

JP   11-60394    3/1999
JP   2001-58900  3/2001
(Continued)

OTHER PUBLICATIONS

US Office Action dated Jul. 18, 2012 in U.S. Appl. No. 12/453,743.
(Continued)

*Primary Examiner* — Melvin C Mayes
*Assistant Examiner* — Guinever Gregorio
(74) *Attorney, Agent, or Firm* — McGinn IP Law Group, PLLC

(57) ABSTRACT

An object of the present invention is to effectively add Ge in the production of GaN through the Na flux method. In a crucible, a seed crystal substrate is placed such that one end of the substrate remains on the support base, whereby the seed crystal substrate remains tilted with respect to the bottom surface of the crucible, and gallium solid and germanium solid are placed in the space between the seed crystal substrate and the bottom surface of the crucible. Then, sodium solid is placed on the seed crystal substrate. Through employment of this arrangement, when a GaN crystal is grown on the seed crystal substrate through the Na flux method, germanium is dissolved in molten gallium before formation of a sodium-germanium alloy. Thus, the GaN crystal can be effectively doped with Ge.

16 Claims, 5 Drawing Sheets

(56) References Cited

U.S. PATENT DOCUMENTS

| | | |
|---|---|---|
| 2006/0169197 A1 | 8/2006 | Sasaki et al. |
| 2008/0271665 A1* | 11/2008 | Yamazaki et al. ............. 117/13 |
| 2009/0173274 A1* | 7/2009 | Sarayama et al. ............. 117/68 |
| 2009/0294909 A1 | 12/2009 | Nagai et al. |
| 2010/0068118 A1* | 3/2010 | Hashimoto et al. ........... 423/409 |
| 2010/0192839 A1* | 8/2010 | Hatakeyama et al. .......... 117/77 |
| 2010/0230713 A1 | 9/2010 | Minemoto et al. |

FOREIGN PATENT DOCUMENTS

| | | |
|---|---|---|
| JP | 2001-64097 | 3/2001 |
| JP | 2004-292286 | 10/2004 |
| JP | 2004-300024 | 10/2004 |
| JP | 4001170 | 8/2007 |
| JP | 2007-277055 | 10/2007 |
| JP | 4030125 | 10/2007 |
| JP | 2008-290929 | 12/2008 |
| WO | WO 2004/067814 A1 | 8/2004 |
| WO | WO 2007/083768 A1 | 7/2007 |

OTHER PUBLICATIONS

Chinese Office Action dated Mar. 21, 2012 (with an English language translation).

* cited by examiner

METHOD FOR PRODUCING GROUP III NITRIDE SEMICONDUCTOR

BACKGROUND OF THE INVENTION

1. Field of the Invention

The present invention relates to a method for producing a Group III nitride semiconductor through the flux method and, more particularly, to a production method realizing effective mixing of a dopant in the molten material.

2. Background Art

The Na flux method is a known method for producing a Group III nitride semiconductor such as GaN. In this method, Na (sodium) and Ga (gallium) are melted and maintained at about 800° C., and gallium is reacted with nitrogen at a pressure of some ten atmospheres, to thereby grow GaN crystals.

For example, Japanese Patent Application Laid-Open (kokai) No. 2008-290929 discloses that addition of silicon (Si) to the molten material in the Na flux method suppresses crystal growth of GaN, and discloses studies on use of germanium (Ge) serving as an n-type dopant.

However, when germanium is added to the material of the flux method, in some cases, an alloy such as $GeNa_3$ is formed from germanium and sodium. Because $GeNa_3$ has a high melting temperature of 820° C. at ambient pressure, Ge is not satisfactorily admixed in a molten mixture of sodium and gallium. That causes raising problems such as variation in Ge concentration of a GaN crystal and generation of a large amount of miscellaneous crystals, leading to a drop in production yield.

SUMMARY OF THE INVENTION

In view of the foregoing, an object of the present invention is to provide a method for producing a Group III nitride semiconductor through the flux method, which production method realizes effective mixing of a dopant in the molten material.

Accordingly, in a first aspect of the invention, there is provided a method for producing a Group III nitride semiconductor, in which a molten mixture containing at least a Group III metal, an alkali metal and a dopant is reacted with a gas containing at least nitrogen, to thereby grow a Group III nitride semiconductor on a seed crystal, wherein the method comprises:

forming a Group III metal liquid from the corresponding Group III metal before formation of an alkali metal liquid from the corresponding alkali metal;

forming a molten mixture by mixing the Group III metal liquid with a dopant;

subsequently, forming the alkali metal liquid from the alkali metal; and bringing the alkali metal liquid into contact with the molten mixture of the Group III metal and the dopant.

Generally, sodium (Na) is employed as the alkali metal of the invention, but potassium (K) may also be used. The term "a gas containing nitrogen" refers to a single-component gas or a gas mixture containing molecular nitrogen or a nitrogen compound, and the gas or gas mixture may further contain an inert gas such as a rare gas.

In the flux method, the dopant is added in order to control physical properties such as conduction type and magnetic properties of the Group III nitride semiconductor to be grown, to promote crystal growth, to prevent generation of miscellaneous crystals, to control crystal growth orientation, and to control other factors. A plurality of dopants may be used.

A second aspect of the invention is drawn to a specific embodiment of the production method according to the first aspect, wherein the molten mixture of the Group III metal and the dopant is a molten alloy of the Group III metal and the dopant.

A third aspect of the invention is drawn to a specific embodiment of the production method according to the second aspect, wherein the dopant is a material which provides a melting temperature of any Group III metal alloy therewith lower than the melting temperature of any alkali metal alloy therewith.

A fourth aspect of the invention is drawn to a specific embodiment of the production method according to any of the first to third aspects, wherein, when the alkali metal, the Group III metal, and the dopant are placed in a crucible, the dopant is placed apart from the alkali metal and in the vicinity of the Group III metal.

A fifth aspect of the invention is drawn to a specific embodiment of the production method according to the fourth aspect, wherein:

the seed crystal is placed on the bottom surface of the crucible so as to be tilted with respect to the bottom surface;

the alkali metal is placed on the seed crystal; and the Group III metal and the dopant are placed on the bottom surface of the crucible or in a space between the bottom surface of the crucible and the back surface of the seed crystal.

A sixth aspect of the invention is drawn to a specific embodiment of the production method according to any of the first to fifth aspects, wherein the dopant is a material which maintains a phase-separation state of a liquid mixture of the alkali metal and the dopant.

A seventh aspect of the invention is drawn to a specific embodiment of the production method according to any of the first to fifth aspects, wherein the alkali metal is sodium, and the dopant is germanium.

An eighth aspect of the invention is drawn to a specific embodiment of the production method according to the sixth aspect, wherein the alkali metal is sodium, and the dopant is zinc.

According to the first aspect of the invention, a dopant can be effectively dissolved in the molten material, whereby high-quality and homogeneous Group III nitride semiconductors can be produced, and the production yield can be enhanced.

As the second aspect of the invention, even in the case where an alloy is formed between a dopant and a Group III metal, the dopant can be effectively dissolved in the molten material. Particularly, as the third aspect of the invention, when a dopant which provides a melting temperature of any Group III metal alloy therewith lower than the melting temperature of any alkali metal alloy therewith is employed, the effect of the present invention can be satisfactorily attained. In this case, the dopant can be highly effectively dissolved in the molten material.

Through placement of materials in a crucible according to the fourth or fifth aspect of the invention, the first aspect of the invention can be readily realized.

As the sixth aspect of the invention, when the dopant is a material which maintains a phase-separation state of a liquid mixture of the alkali metal and the dopant, the effect of the present invention can be satisfactorily attained. In the case where sodium is employed as the alkali metal, the dopant as described in the third aspect is, for example, germanium as described in the seventh aspect, and the dopant as described in the sixth aspect is, for example, zinc as described in the eighth aspect.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

With reference to the drawings, the present invention will next be described by way of examples, which should not be construed as limiting the present invention thereto.

Example 1

Figure 1:
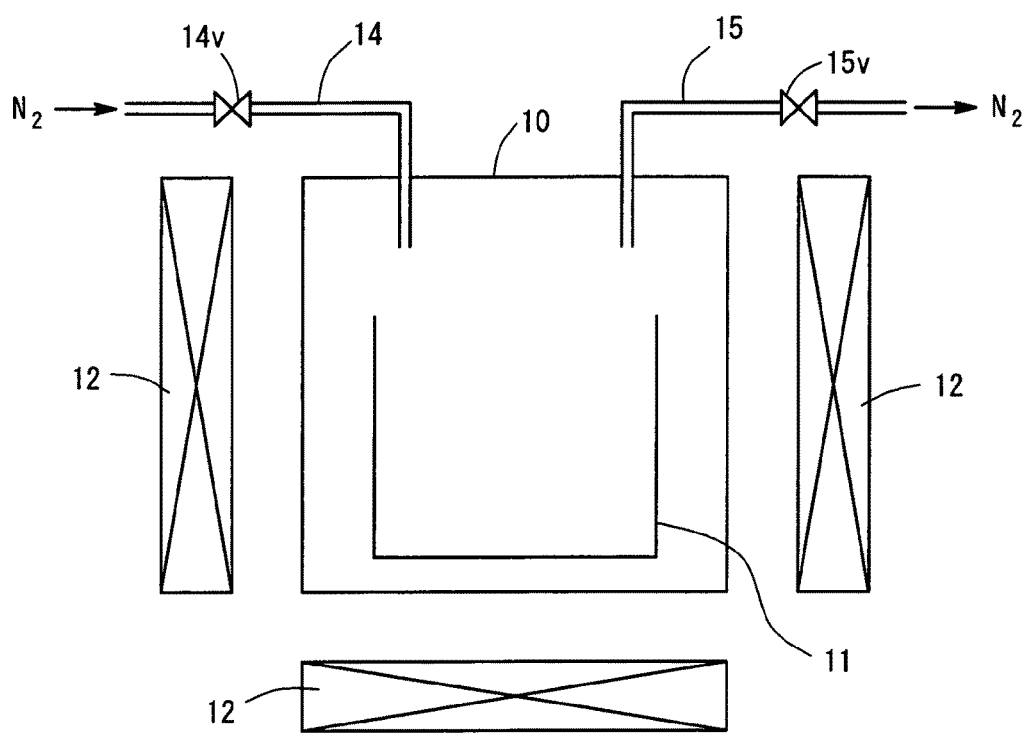
FIG. 1 is a schematic view of an apparatus for producing a Group III nitride semiconductor.

FIG. 1 is a schematic view of an apparatus for producing a Group III nitride semiconductor employed in production of n-GaN of Example 1. As shown in FIG. 1, the apparatus for producing a Group III nitride semiconductor includes a reaction vessel 10; a crucible 11 which is placed in the reaction vessel 10; a heating apparatus 12 for heating the reaction vessel 10; a supply pipe 14 for supplying nitrogen to the reaction vessel 10; and a discharge pipe 15 for discharging the atmosphere gas in the reaction vessel 10 to the outside.

The reaction vessel 10 is a cylinder made of stainless steel and has resistance to pressure and heat. The crucible 11 made of $Al_2O_3$ (alumina) is placed in the reaction vessel 10. The crucible 11 has an inner diameter of 66 mm.

A pressure container may be placed in the Group III nitride semiconductor production apparatus, and the reaction vessel 10 and the heating apparatus 12 may be placed in the pressure container. When the reaction vessel 10 is placed in the pressure container, the reaction vessel 10 does not necessarily have high pressure resistance. Thus, an inexpensive and large-scale reaction vessel may be employed as the reaction vessel 10.

The supply pipe 14 is equipped with a valve 14v, through which the amount of nitrogen supplied to the reaction vessel is controlled. The discharge tube 15 is equipped with a valve 15v, through which the amount of discharge from the reaction vessel 10 is controlled.

Next, a method of producing n-GaN doped with germanium serving as an n-type dopant will be described.

Figure 2A:
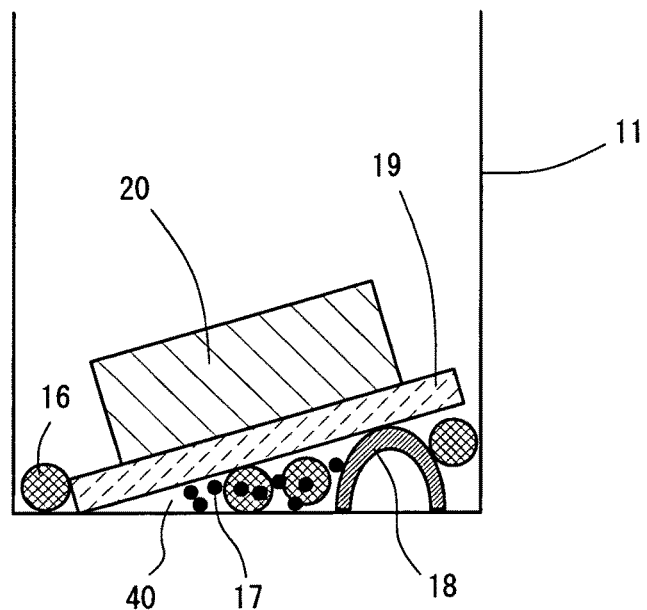
FIG. 2A is a sketch showing the arrangement of materials in a crucible 11 in the production method according to Example 1.

As shown in FIG. 2A, in an alumina crucible 11 (inner diameter: 66 mm), gallium solid 16 (55 g), germanium solid 17 (0.1 g), carbon (not illustrated) (0.1 g), and a support base 18 are placed. Subsequently, a seed crystal substrate 19 is placed such that one end of the substrate remains on the support base 18, whereby the seed crystal substrate 19 remains tilted with respect to the bottom surface of the crucible 11, and gallium solid 16 and germanium solid 17 are placed in the space 40 between the seed crystal substrate 19 and the bottom surface of the crucible 11. Then, sodium solid 20 (49 g) is placed on the seed crystal substrate 19. Through this arrangement, germanium solid 17 is present in closer vicinity to gallium solid 16 than to sodium solid 20. That is, sodium solid 20 is separated from solid germanium 17 by the mediation of the seed crystal substrate 19, with direct contact between sodium solid 20 and germanium solid 17 being prevented. The amount of germanium solid 17 added to the crucible is about 0.5 mol % with respect to the total amount of gallium solid 16, germanium solid 17, and sodium solid 20. Then, the crucible 11 is placed in the reaction vessel 10, and the reaction vessel 10 is tightly closed. Notably, the reason for adding carbon is that carbon, serving as a catalyst, facilitates incorporation of germanium serving as a donor into a GaN crystal.

The seed crystal substrate 19 may be a GaN substrate or a template substrate which is produced by growing GaN on a hetero-substrate (e.g., sapphire substrate) through MOCVD. The seed crystal substrate employed may be a substrate of any surface orientation; such as a c-plane substrate, an a-plane substrate, or an m-plane substrate.

Placement of the materials in the crucible 11, and placement of the crucible 11 in the reaction vessel 10 should be carried out in a glove box filled with an inert gas (e.g., Ar gas), since, when such operations are performed in air, Na is immediately oxidized.

Subsequently, the valve 14v of the supply pipe 14 and the valve 15v of the discharge pipe 15 are opened, to thereby supply nitrogen to the reaction vessel 10. Through regulating the valves 14v, 15v, the inside pressure of the reaction vessel 10 is elevated to 4.2 MPa, and the temperature of the vessel is elevated to 870° C. by means of the heating apparatus 12.

In the course of the temperature elevation process, gallium solid 16, having a melting temperature of about 30° C. at ambient pressure, is melted to gallium liquid. When germanium solid comes into contact with the molten gallium, solid germanium 17 is dissolved in the molten gallium. In this case, germanium solid 17 is present in closer vicinity to gallium solid 16 than to sodium solid 20, and sodium solid 20 is separated from solid germanium 17 by the mediation of the seed crystal substrate 19, with direct contact between sodium solid 20 and germanium solid 17 being prevented. Therefore, a molten mixture of gallium and germanium is formed before formation of a sodium-germanium alloy having a high melting temperature.

Then, as the temperature rises, sodium solid 20 having a melting temperature of about 98° C. at ambient pressure melts to form sodium liquid, which flows into the space 40 under the seed crystal substrate 19. The sodium liquid is mixed with a molten mixture of gallium and germanium. Since no sodium-germanium alloy is formed, a portion of a sodium-germanium alloy in the solid form undissolved in a molten mixture of gallium and sodium, which would conventionally remain, does not remain. As a result, germanium is completely dissolved in the molten mixture of gallium and sodium at the crystal growth temperature.

After production of a germanium-dissolved molten mixture of gallium and sodium, the conditions (4.2 MPa, 870° C.) are maintained for 120 hours, to thereby grow a GaN crystal on the seed crystal substrate 19. In a preferred mode, the Group III nitride semiconductor production apparatus is equipped with a rotating apparatus for sustaining and rotating the crucible 11, or with a swinging apparatus for swinging the crucible, whereby the crucible 11 is rotated or swung during crystal growth. In this case, since the molten mixture is stirred through rotation or swinging of the crucible 11, GaN can be grown uniformly.

Figure 3:
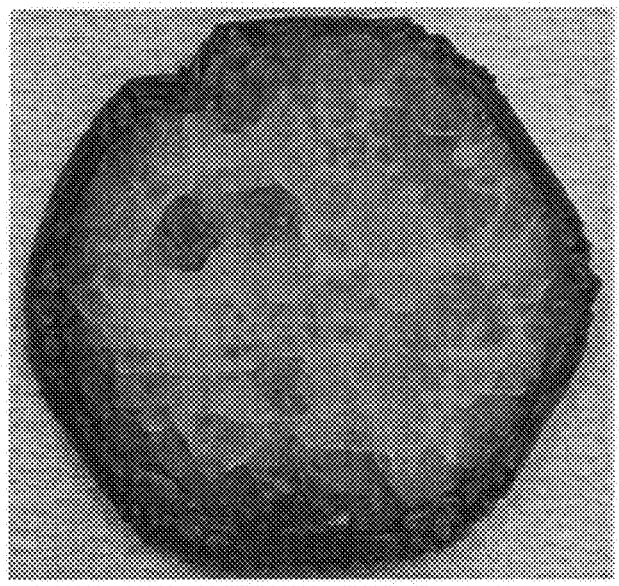
FIG. 3 is a photograph of an n-GaN crystal grown through the production method according to Example 1.
Figure 4:
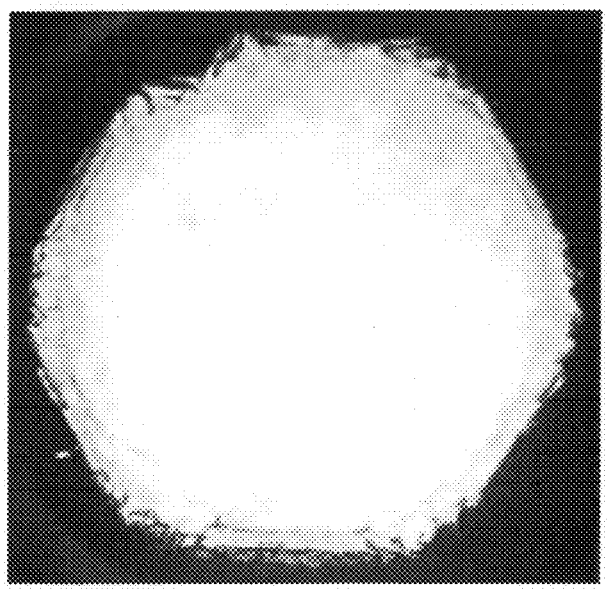
FIG. 4 is a fluorescence microscopic image of an n-GaN crystal grown through the production method according to Example 1.

Subsequently, heating by means of the heating apparatus 12 is stopped, and the temperature and pressure are lowered to ambient conditions. The reaction vessel 10 is opened, and the crucible 11 is taken out. The molten mixture remaining in the crucible 11 is removed, and a Ge-doped n-GaN crystal which has been grown on the seed crystal substrate 19 is taken out. As shown in FIG. 3, the n-GaN crystal has been uniformly grown on the entire surface of the seed crystal substrate 19. FIG. 4 is a fluorescence microscopic image of the thus-grown n-GaN crystal. As shown in FIG. 4, light emission was observed from the entire surface of the crystal, confirming that the n-GaN crystal is uniformly doped with Ge. The obtained n-GaN crystal was polished and subjected to SIMS analysis and Hall measurement. The Ge concentration was $1 \times 10^{19}/cm^3$, and the resistivity was 0.03 $\Omega$cm. Uniform Ge doping was observed in the entire surface.

Figure 5:
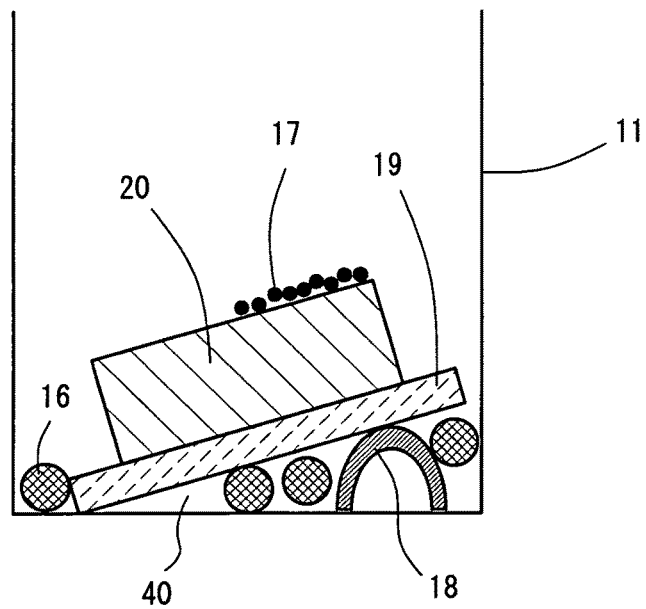
FIG. 5 is a sketch showing the arrangement of materials in a crucible 11 in the production method according to Comparative Example.

The thus-produced n-GaN crystal was compared with a similar n-GaN crystal produced through a production method of Comparative Example as shown in FIG. 5. In the comparative method, the procedure of Example 1 was repeated, except that gallium solid 16 was placed in the space 40 between the seed crystal substrate 19 and the bottom surface of the crucible 11, and germanium solid 17 and sodium solid 20 were placed on the seed crystal substrate 19, to thereby produce an n-GaN crystal. The n-GaN crystal of Comparative Example was found to have a portion where growth failed. In other words, uniform growth on the entire surface of the seed crystal substrate 19 was not attained. A non-uniform fluorescence microscopic image of the n-GaN crystal of Comparative Example indicates that the n-GaN crystal was not uniformly doped with Ge.

As described above, in the GaN production method of Example 1, gallium solid 16 is in direct contact with germanium solid 17, and sodium solid 20 is not in direct contact with germanium solid 17. In the course of temperature elevation, gallium becomes liquid before formation of sodium liquid, and the gallium liquid comes into contact with germanium solid 17 without establishing contact between sodium liquid and germanium solid. Therefore, no sodium-germanium alloy having a high melting temperature is formed, and germanium is melted in liquid of gallium having a low melting temperature. Subsequently, sodium becomes liquid, and the sodium liquid comes into contact with the molten mixture of gallium and germanium. Therefore, germanium can be effectively melted in the molten mixture of sodium and gallium. As a result, a high-quality n-GaN crystal having no variation in germanium concentration can be produced.

Figure 2B:
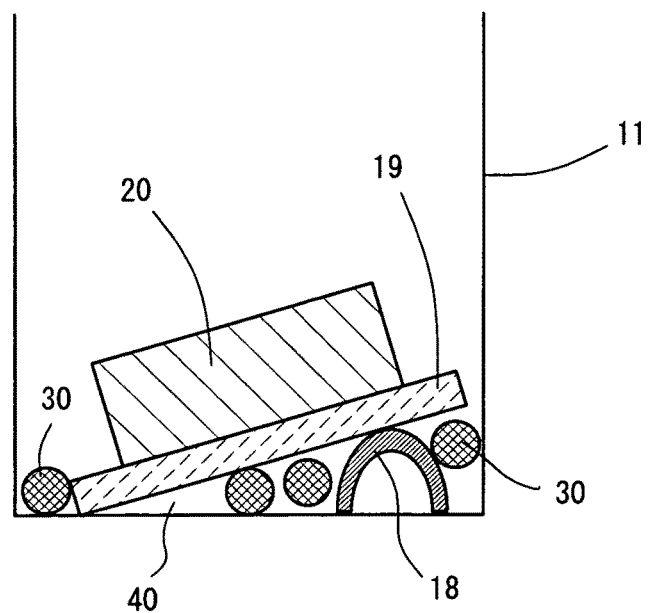
FIG. 2B is a sketch showing the arrangement of materials in a crucible 11 in the production method according to a variation of Example 1.

Alternatively, the following arrangement in the crucible 11 may be employed. Firstly, gallium solid 16 is melted, and germanium solid 17 is melted in the molten gallium. The molten mixture is cooled, to thereby form a gallium-germanium alloy 30. Then, as shown in FIG. 2B the gallium-germanium alloy 30, sodium solid 20, and the seed crystal substrate 19 are placed in the crucible 11. Through employment of this arrangement, in the course of temperature elevation, the gallium-germanium alloy is firstly melted, and then sodium solid 20 is melted. In other words, molten sodium comes into contact with the molten mixture of gallium and germanium. Therefore, germanium can be effectively melted in the molten mixture of sodium and gallium.

Example 2

Figure 6:
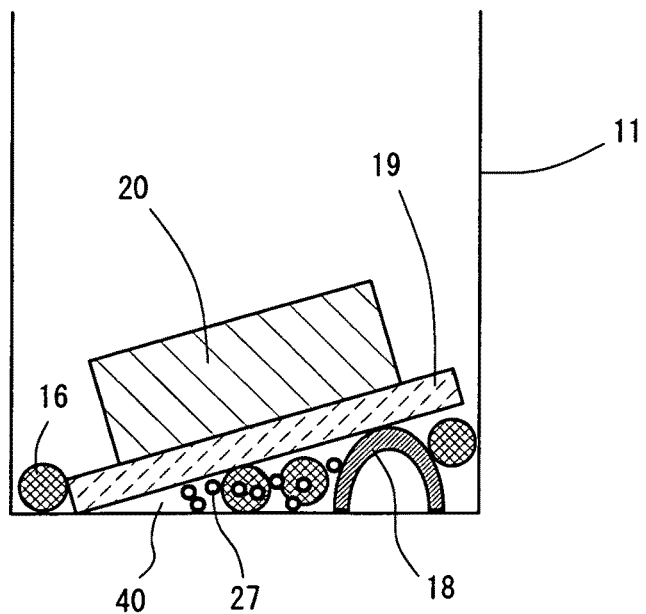
FIG. 6 is a sketch showing the arrangement of materials in a crucible 11 in the production method according to Example 2.

In Example 2, zinc solid 27 is employed as a dopant instead of germanium solid 17 as employed in Example 1. As shown in FIG. 6, a seed crystal substrate 19 is placed such that one end of the substrate remains on the support base 18, whereby the seed crystal substrate 19 remains tilted with respect to the bottom surface of the crucible 11, and gallium solid 16 and zinc solid 27 are placed in the space 40 between the seed crystal substrate 19 and the bottom surface of the crucible 11, and sodium solid 20 is placed on the seed crystal substrate 19. The GaN production method of Example 1 is performed, except that the above arrangement in the crucible 11 is employed, to thereby grow a Zn-doped GaN crystal on the seed crystal substrate 19. Zn is doped in order to impart a p-conduction type to GaN or insulate GaN.

As described above, gallium solid 16 and zinc solid 27 are separated from solid sodium 20 by the mediation of the seed crystal substrate 19. In the course of temperature elevation, gallium solid 16 is firstly melted to form gallium liquid. When in contact with the molten gallium, zinc solid 27 is melted in the molten gallium. Subsequently, as the temperature rises, sodium solid 20 is melted to form sodium liquid, which flows to the space 40 under the seed crystal substrate 19. The sodium liquid is mixed with a molten mixture of gallium and zinc. Generally, zinc liquid and sodium liquid are non-compatible with each other, and phase separation such as water-oil separation occurs. When the arrangement of Example 2 is employed, co-presence of zinc liquid and sodium liquid is avoided during temperature elevation, to thereby prevent phase separation. Therefore, zinc can be effectively melted in the molten mixture of sodium and gallium.

Thus, when Zn is added as a dopant, a high-quality Zn-doped GaN crystal having no variation in Zn concentration can be produced. When the method of the Example 2 is used, any dopant other than zinc may be used even if the dopant is a material which maintains a phase-separation state of a liquid mixture of the alkali metal and the dopant.

In the above Examples, sodium is employed as a flux. However, other alkali metals such as potassium may also be used. The above Examples are directed to the method of producing GaN. However, the present invention is not limited to the production of GaN, and the method of the invention may be applicable to production of crystals of Group III nitride semiconductors such as AlGaN, InGaN, and AlGaInN. In the above Examples, a single kind of dopant is used. However, a plurality kinds of dopants may be added.

In the above Examples, gallium is mixed with germanium or zinc without any additional operation during temperature elevation, and contact of germanium or zinc with sodium does not occur. Then, the mixture of gallium and the dopant is mixed with sodium. However, the present invention is not limited to this sequence. The timing of heating (i.e., temperature elevation) may be selected as desired, so long as the Group III metal is melted before forming alkali metal liquid; dissolving a dopant in the molten Group III metal; then melting the alkali metal; and bringing the molten alkali metal into contact with the molten mixture of the Group III metal and the dopant.

The present invention also encompasses the following specific features.

(1) A method for producing a Group III nitride semiconductor based on the flux method, in which a solid alkali metal, a solid Group III metal, and a solid dopant are maintained in a crucible; a gas containing at least nitrogen is fed to the crucible; a solution of the solid alkali metal, the solid Group III metal, and the solid dopant is formed through a pressure and temperature elevation step; and a Group III nitride semiconductor is grown from the solution on a seed crystal at the crystal growth temperature, wherein the production method comprises:

in the temperature elevation step, forming a Group III metal liquid from the corresponding solid Group III metal before formation of the alkali metal liquid from the corresponding solid alkali metal;

dissolving the solid dopant in the Group III metal liquid, without bringing the Group III metal liquid into contact with the solid alkali metal;

subsequently, forming the alkali metal liquid from the solid alkali metal;

bringing the alkali metal liquid into contact with the molten mixture of the Group III metal and the dopant; and finally, forming a molten mixture of the alkali metal, Group III metal, and dopant before attainment of the Group III nitride semiconductor growth temperature.

(2) A method for producing a Group III nitride semiconductor according to (1) above, wherein, when the solid alkali metal, the solid Group III metal, and the solid dopant are placed in a crucible, the solid dopant is placed apart from the solid alkali metal and in the vicinity of the solid Group III metal.

(3) A method for producing a Group III nitride semiconductor according to (2) above, wherein:

the seed crystal is placed on the bottom surface of the crucible so as to be tilted with respect to the bottom surface;

the solid alkali metal is placed on the seed crystal; and the solid Group III metal and the solid dopant are placed on the bottom surface of the crucible or in a space between the bottom surface of the crucible and the back surface of the seed crystal.

Group III nitride semiconductors produced according to the present invention may be used as a growth substrate or the like for manufacturing semiconductor devices.

What is claimed is:

1. A method for producing a Group III nitride semiconductor, in which a molten mixture for a crystal growth comprising at least a Group III metal, an alkali metal and a dopant is reacted with a gas comprising at least nitrogen, to thereby grow a Group III nitride semiconductor on a seed crystal, wherein the method comprises:

placing the seed crystal, a solid alkali metal, a solid Group III metal, and a solid dopant in a crucible, such that the solid dopant is placed apart from the solid alkali metal and in a vicinity of the solid Group III metal;

forming a Group III metal liquid from the solid Group III metal before formation of an alkali metal liquid from the solid alkali metal by elevating a temperature of the crucible;

forming a molten mixture by contacting the Group III metal liquid with the solid dopant in the crucible to be dissolved in the Group III metal liquid;

subsequently, forming the alkali metal liquid from the solid alkali metal in the elevating of the temperature;

bringing the alkali metal liquid into contact with the molten mixture comprising the Group III metal and the dopant to make the molten mixture for a crystal growth; and growing the Group III nitride semiconductor on the seed crystal.

2. A method for producing a Group III nitride semiconductor according to claim 1, wherein the dopant comprises a material which provides a melting temperature of any Group III metal alloy therewith lower than a melting temperature of any alkali metal alloy therewith.

3. A method for producing a Group III nitride semiconductor according to claim 1, wherein the seed crystal is placed on a bottom surface of the crucible so as to be tilted with respect to the bottom surface, wherein the solid alkali metal is placed on the seed crystal, and wherein the solid Group III metal and the solid dopant are placed on the bottom surface of the crucible or in a space between the bottom surface of the crucible and a back surface of the seed crystal.

4. A method for producing a Group III nitride semiconductor according to claim 1, wherein the solid dopant comprises a material which maintains a phase-separation state of a liquid mixture of the alkali metal and the dopant.

5. A method for producing a Group III nitride semiconductor according to claim 1, wherein the solid alkali metal comprises sodium, and the solid dopant comprises germanium.

6. A method for producing a Group III nitride semiconductor according to claim 4, wherein the solid alkali metal comprises sodium, and the solid dopant comprises zinc.

7. A method for producing a Group III nitride semiconductor, in which a molten mixture for a crystal growth comprising at least a Group III metal, an alkali metal and a dopant is reacted with a gas comprising at least nitrogen, to thereby grow a Group III nitride semiconductor on a seed crystal, wherein the method comprises:

placing the seed crystal, a solid alkali metal, and a solid Group III metal-dopant alloy in a crucible;

forming a molten mixture comprising the Group III metal and the dopant from the solid Group III metal-dopant alloy before formation of an alkali metal liquid from the solid alkali metal by elevating a temperature of the crucible;

subsequently, forming the alkali metal liquid from the solid alkali metal in the elevating of the temperature;

bringing the alkali metal liquid into contact with the molten mixture comprising the Group III metal and the dopant to make the molten mixture for a crystal growth; and growing the Group III nitride semiconductor on the seed crystal.

8. A method for producing a Group III nitride semiconductor according to claim 7, wherein the dopant comprises a material which provides a melting temperature of any Group III metal alloy therewith lower than a melting temperature of any alkali metal alloy therewith.

9. A method for producing a Group III nitride semiconductor according to claim 7, wherein the solid Group III metal-dopant alloy is placed apart from the solid alkali metal.

10. A method for producing a Group III nitride semiconductor according to claim 7, wherein the solid dopant comprises a material which maintains a phase-separation state of a liquid mixture of the alkali metal and the dopant.

11. A method for producing a Group III nitride semiconductor according to claim 10, wherein the solid alkali metal comprises sodium, and the dopant of the solid Group III metal-dopant alloy comprises zinc.

12. A method for producing a Group III nitride semiconductor according to claim 7, wherein the solid alkali metal comprises sodium, and the dopant of the solid Group III metal-dopant alloy comprises germanium.

13. A method for producing a Group III nitride semiconductor, in which a molten mixture comprising at least a Group III metal, an alkali metal and a dopant is reacted with a gas comprising at least nitrogen, to thereby grow a Group III nitride semiconductor on a seed crystal, wherein the method comprises:

forming a Group III metal liquid from a corresponding Group III metal before formation of an alkali metal liquid from a corresponding alkali metal;

forming a molten mixture by mixing the Group III metal liquid with a dopant; subsequently, forming the alkali metal liquid from the alkali metal; and bringing the alkali metal liquid into contact with the molten mixture of the Group III metal and the dopant, wherein the seed crystal is placed on a bottom surface of the crucible so as to be tilted with respect to the bottom surface, wherein the alkali metal is placed on the seed crystal, and wherein the Group III metal and the dopant are placed on the bottom surface of the crucible or in a space between the bottom surface of the crucible and a back surface of the seed crystal, wherein the seed crystal is placed on a bottom surface of the crucible so as to be tilted with respect to the bottom surface, wherein the solid alkali metal is placed on the seed crystal, and wherein the Group III metal and the dopant are solid Group III metal-dopant alloy is placed on the bottom surface of the crucible or in a space between the bottom surface of the crucible and a back surface of the seed crystal.

14. A method for producing a Group III nitride semiconductor according to claim 13, wherein the dopant comprises a material which maintains a phase-separation state of a liquid mixture of the alkali metal and the dopant.

15. A method for producing a Group III nitride semiconductor according to claim 13, wherein the alkali metal comprises sodium, and the dopant comprises germanium.

16. A method for producing a Group III nitride semiconductor according to claim 13, wherein the dopant is placed apart from the alkali metal and in a vicinity of the Group III metal.

* * * * *

UNITED STATES PATENT AND TRADEMARK OFFICE
CERTIFICATE OF CORRECTION

Page 1 of 1

PATENT NO.         : 8,501,141 B2
APPLICATION NO.    : 12/662006
DATED              : August 6, 2013
INVENTOR(S)        : Takayuki Sato et al.

It is certified that error appears in the above-identified patent and that said Letters Patent is hereby corrected as shown below:

In the Claims

1. Col. 8, line 38, change "semiconductor on the seed crystal." to "semiconductor on the seed crystal, wherein the seed crystal is placed on a bottom surface of the crucible so as to be tilted with respect to the bottom surface, wherein the solid alkali metal is placed on the seed crystal, and wherein the Group III metal and the dopant are solid Group III metal-dopant alloy is placed on the bottom surface of the crucible or in a space between the bottom surface of the crucible and a back surface of the seed crystal."

2. Col. 9, line 21, change "back surface of the seed crystal, wherein the seed crystal is placed on a bottom surface of the crucible so as to be tilted with respect to the bottom surface, wherein the solid alkali metal is placed on the seed crystal, and wherein the Group III metal and the dopant are solid Group III metal-dopant alloy is placed on the bottom surface of the crucible or in a space between the bottom surface of the crucible and a back surface of the seed crystal." to "back surface of the seed crystal."

Signed and Sealed this
Eleventh Day of March, 2014

Michelle K. Lee
*Deputy Director of the United States Patent and Trademark Office*